United States Patent [19]
Smythe et al.

[11] Patent Number: 6,156,653
[45] Date of Patent: Dec. 5, 2000

[54] METHOD OF FABRICATING A MOS DEVICE

[75] Inventors: John A. Smythe; John E. Berg, both of Boise, Id.

[73] Assignee: Zilog, Inc., Campbell, Calif.

[21] Appl. No.: 08/962,828

[22] Filed: Nov. 3, 1997

[51] Int. Cl.[7] .................................................. H01L 21/44
[52] U.S. Cl. ......................... 438/680; 438/629; 438/758; 438/778
[58] Field of Search .............................. 438/38; 257/607, 257/629; 458/758, 778, 680

[56] References Cited

U.S. PATENT DOCUMENTS

| | | | |
|---|---|---|---|
| 5,240,880 | 8/1993 | Hindman et al. | 437/190 |
| 5,820,942 | 12/1996 | Singh et al. | 427/508 |
| 5,872,387 | 1/1996 | Lyding et al. | 257/607 |

OTHER PUBLICATIONS

Shiraiwa, Toshiaki et al.; "Characterization of Chemical–Vapor–Deposited Amorphous–Silicon Films"; *Japanese Journal of Applied Physics*; vol. 32, No. 1A/B; Jan. 15, 1993; pp. L20–L23.

Wilson, R.G. et al.; "Outdiffusion of deuterium from GaN, AlN, and InN"; *Journal of Vacuum Science & Technology A*; vol. 13, No. 3, Part I; May/Jun., 1995; pp. 719–723.

McCluskey, M.D. et al.; "Vibrational spectroscopy of arsenic–hydrogen complexes in ZnSe"; *Applied Physics Letters*; vol. 68, No. 23; Jun. 3, 1996; pp. 3476–3478.

Srinivasan, Easwar and Gregory N. Parsons; "Hydrogen elimination and phase transitions in pulsed–gas plasma deposition of amorphous and microcrystalline silicon"; *Journal of Applied Physics*; vol. 81, No. 6; Mar. 15, 1997; pp. 2847–2855.

*Primary Examiner*—David Nelms
*Assistant Examiner*—Reneé R. Berry
*Attorney, Agent, or Firm*—Majestic, Parsons, Siebert & Hsue

[57] ABSTRACT

Deposited dielectric layers for a semiconductor device are typically formed in a chemical vapor deposition. Often a hydrogen by-product is formed. Especially in a plasma enhanced chemical vapor deposition process, the hydrogen by-product can form free radicals that are introduced into the dielectric layers. The hydrogen free radicals can affect the stability of the threshold and breakdown voltage of MOS-FET transistors. Deuterium introduced into the CVD chamber competes to enter the dielectric layer with the hydrogen. The deuterium prevents some of the hydrogen free radicals from entering the dielectric layer and thus increases MOSFET reliability.

15 Claims, 2 Drawing Sheets

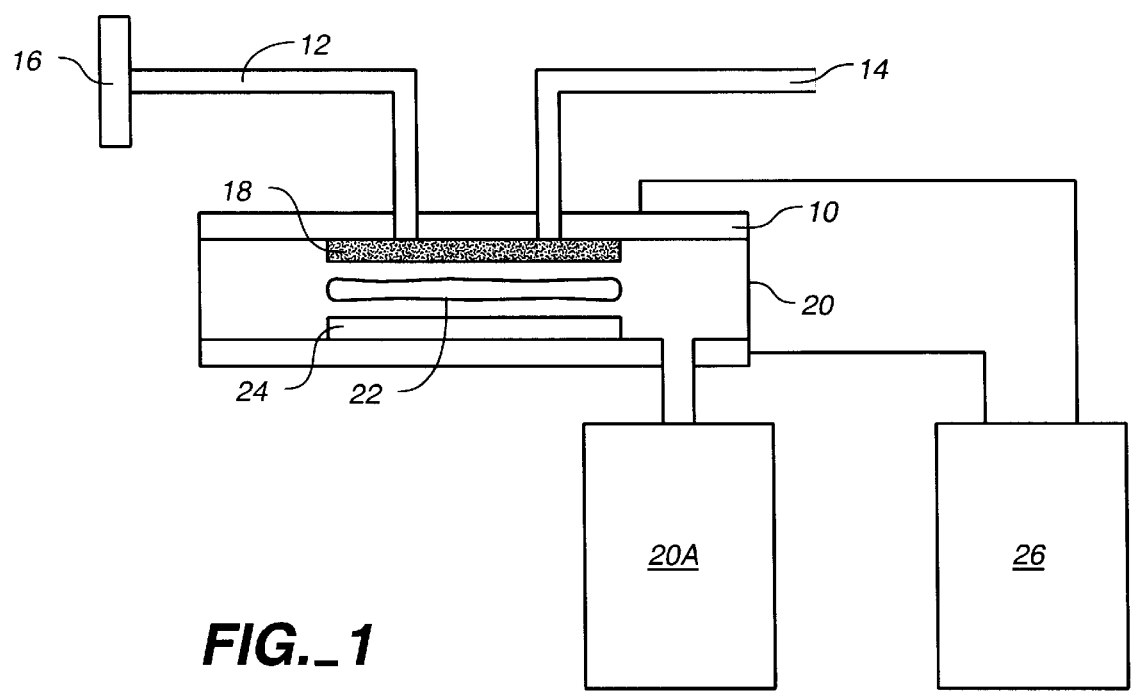
FIG._1

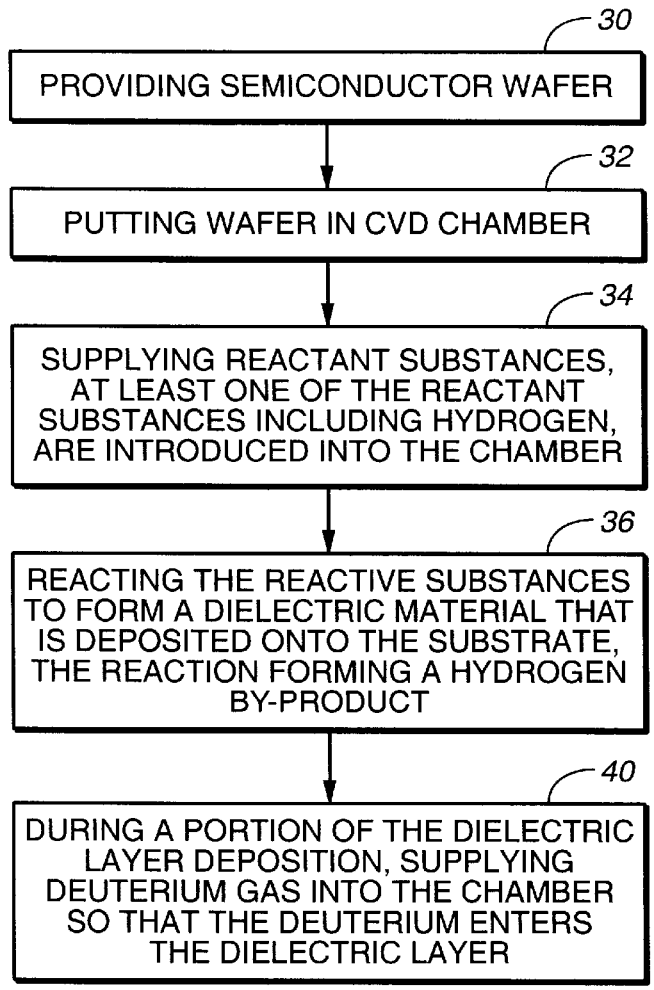
FIG._2
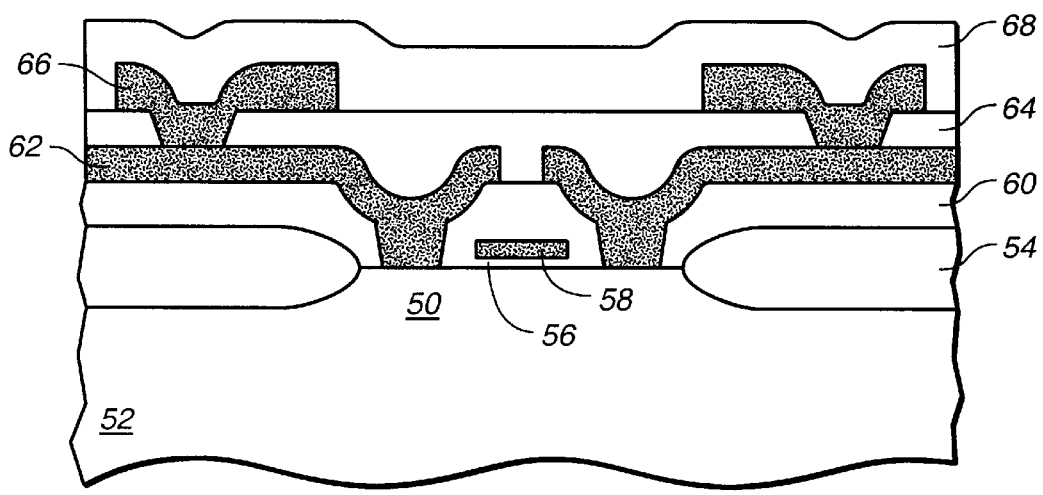
FIG._3

METHOD OF FABRICATING A MOS DEVICE

BACKGROUND OF THE INVENTION

The present invention relates to methods for forming semiconductor devices. In particular, the present invention relates to methods for forming dielectric layers on semiconductor devices.

Dielectric layers on semiconductor devices are used to isolate or protect other layers. Currently silicon dioxide, silicon nitride and silicon oxynitride are the most commonly used dielectric layers.

One type of dielectric layer is a thermally-grown silicon dioxide. Thermally-grown oxides are formed by reacting silicon on the substrate with oxygen at high temperatures. Field and gate oxide layers are examples of thermally-grown oxides.

Another type of dielectric layer is a deposited dielectric layer. Deposited dielectric layers include interlevel dielectric layers such as boro-phosphorous silicate glass (BPSG), inter-metallic dielectric layers and passivation layers. Typically, deposited dielectrics are formed with a chemical vapor deposition (CVD) system. Common CVD systems include plasma enhanced chemical vapor deposition (PECVD) and low pressure chemical vapor deposition (LPCVD). In chemical vapor deposition, reactants in a gas or vapor react to form a dielectric material which is deposited on the substrate. To form a deposited silicon dioxide layer, typically a mixture of nitrous oxide ($N_2O$), silane ($SiH_4$) and tetra-ethyl-ortho-silicate (TEOS) are used. To form a nitride layer, such as $Si_3N_4$, the reactant substances include silane and ammonia $NH_3$. To form a combined oxynitride, a mixture of silane, nitrous oxide and ammonia is used.

A concern with metal-oxide-silicon field-effect-transistors (MOSFETS) is the need to maintain stable and reliable threshold and breakdown voltage values. It is desired to improve the processing steps used to form the dielectric layers to help obtain stable and reliable threshold and breakdown voltage values for MOSFETS.

SUMMARY OF THE INVENTION

The CVD deposition of dielectric layers typically uses reactant substances which include hydrogen. These reactant substances include silane, ammonia and TEOS. Such CVD depositions produce hydrogen gas as a by-product. Especially when a plasma is used, the hydrogen gas can break down into free radicals which do not easily recombine. These hydrogen free radicals become a part of the deposited dielectric layer as it forms.

It has been found that hydrogen can be between five to fifteen percent by weight of a deposited dielectric layer. Because the hydrogen free radicals are charged, hydrogen free radicals entrapped in the dielectric layer can adversely affect MOSFET performance. The entrapped charged particles can vary the threshold voltage and breakdown voltage for a MOSFET. Such changes may not be immediately apparent and may occur after the integrated circuit (IC) is sent to a customer. Additionally, a signal pattern can cause the entrapped hydrogen free radicals to migrate and adversely affect the performance.

The present invention involves supplying deuterium into the CVD chamber. Deuterium competes with the more common isotope of hydrogen to enter the dielectric layer. Additionally, deuterium is more stable than the common isotope of hydrogen and is thus less likely to form free radicals which can adversely affect the MOSFET performance.

Deuterium has been used in the past in the forming of polysilicon layers. Deuterium affects the micro-crystalline structure of the polysilicon layer as it forms. See, for example, T. Shiraiwa et al.; "Characterization of Chemical-Vapor-Deposited Amorphous-Silicon Films"; *Jpn. J. Appl. Phys.* 32; Jan. 15, 1993; Pt. 2, No. 1A/B; pp. L20–23; and E. Srinivasan and G. N. Parsons; "Hydrogen elimination and phase transitions in pulsed-gas plasma deposition of amorphous and microcrystalline silicon"; *J. Appl. Phys.*; Vol. 81, No. 6; Mar. 15, 1997; pp. 2847–2855. In its prior use, deuterium was not used to form a dielectric layer. Additionally, dielectric layers do not require a specific micro-crystalline structure. Furthermore, in the prior art, deuterium was not used to compete with a hydrogen by-product during a layer deposition.

In one embodiment of the present invention, deuterium is added in the deposition of the dielectric layer when the deposition is caused by reactive substances which produce hydrogen by-products.

Another embodiment of the present invention is a chemical vapor deposition system arranged with a deuterium supply and reactant substance supplies, where the reactant substances form a hydrogen by-product.

Another embodiment of the present invention comprises a semiconductor device having a dielectric layer including at least some deuterium. Having a dielectric layer including at least some deuterium has advantages over dielectric layers that include hydrogen by-products which are not deuterium.

BRIEF DESCRIPTION OF THE DRAWINGS

The above and other features and aspects of the present invention will become more apparent upon reading the following detailed description in conjunction with the accompanying drawings, in which:

FIG. 1 is a diagram of a plasma-enhanced chemical vapor deposition system using deuterium as a supplied gas;

FIG. 2 is a flowchart of the method of the present invention; and

FIG. 3 is a diagram of a semiconductor device showing a dielectric layer formed so as to include at least some deuterium.

DETAILED DESCRIPTION OF THE PREFERRED EMBODIMENT

FIG. 1 is a diagram of a plasma enhanced chemical vapor deposition system 10 using deuterium 14 as EL supply gas. The system shown is a plasma enhanced chemical vapor deposition (PECVD) system, but the present invention is applicable to other chemical vapor deposition systems such as a low pressure chemical vapor deposition (LPCVD) system. The vapor and gas supply 12 includes the reactant supplies 16. The reactant substances 16 in the shown embodiment are used to form a silicon dioxide layer. The reactants include silane, nitrous oxide and TEOS. The reactants can be provided as a vapor from a liquid supply or as a gas.

The reactant substances are sent through a shower head 18 into a chamber 20. Since the reactant substances form hydrogen as a by-product, the formed plasma 22 will include hydrogen free radicals.

In the present invention, deuterium 14 is added to the CVD chamber 20 during at least a portion of the time in which the dielectric layer is formed. Deuterium is more stable than the more common isotope of hydrogen upon completion of the film deposition, and forms fewer free radicals after the dielectric layer is deposited on the wafer 24.

An RF power supply 26 is used to produce the plasma. In a preferred embodiment, dual RF signals including 40 Hz and 13.56 MHz are used in order to reduce film stress.

In a manner known in the art, the temperature of the wafer is maintained relatively low, preferably at about 250° C. to 420° C. This is especially important when the dielectric layer is formed after a metal layer, because higher temperatures can melt the metal layer.

The pump 20a removes molecules from the chamber to produce low pressure in chamber 20 so as to form the plasma. The removed molecules will include some hydrogen prevented from entering the dielectric layer by the introduced deuterium.

In a preferred embodiment, the chemical vapor deposition system may be a Novellus Concept One available from the Novellus Company of San Jose, Calif.

FIG. 2 illustrates a method of the present invention. In step 30, a semiconductor wafer is provided. In step 32, the wafer is placed within a CVD chamber. In step 34, reactant substances including hydrogen are introduced into the CVD chamber.

In step 36, the reactant substances react together to form a dielectric material which is deposited on the substrate. The reaction forms hydrogen as a by-product. During at least a portion of the dielectric layer deposition, deuterium gas is supplied into the chamber so that the deuterium enters the dielectric layer. In one embodiment, deuterium is present for only part of the dielectric layer forming step. For example, deuterium can be present for the beginning, middle or end of the dielectric layer deposition. Supplying deuterium during only a portion of the dielectric layer deposition may be beneficial because the specific composition of the dielectric layer needs to be compatible with any neighboring layer. Furthermore, the effect of free radicals from the deposited layer on the threshold voltage and breakdown voltage of a MOSFET can be minimized through the use of deuterium in the film's deposition.

FIG. 3 is a diagram of a semiconductor device 50 showing dielectric layers 60, 64 and 68 including deuterium. The semiconductor device 50 includes a silicon substrate 52. Field oxide layers 54 and gate oxide layer 56 are thermally grown on the substrate 52. A polysilicon layer 58 is formed on top of the gate oxide 56. An interlevel oxide 60, such as BPSG, is formed by a deposition process. Next, a metal interconnect layer 62 is formed on top of the BPSG 60. An intermetallic dielectric 64 is deposited on top of the metal layer 62. Layers formed after the metal layer 62 should be done at a relatively low temperature, for example below 420° C., so as to avoid reflowing the metal layer 62. Next, the second metal layer 66 is formed over the intermetallic dielectric layer 64. Finally, a deposited passivation layer 68 is formed on top of the metal layer 66 to protect the other semiconductor layers.

The interlevel dielectric 60, intermetallic layer 64, and passivation layer 68 can include some deuterium for the reasons described above. There is no reason to add deuterium to the field oxide layer 54 and gate oxide layer 56, because hydrogen does not remain in the film due to the temperature in the process chamber when these layers are formed.

In a preferred embodiment, over one percent by weight of a deposited dielectric layer is deuterium. Additionally, in another preferred embodiment the percent by weight of deuterium is at least a fifth of the percent by weight of hydrogen present in the dielectric layer. Replacing at least fifty percent of the hydrogen with deuterium is currently believed to be possible with the method of the present invention. various details of the implementation and method are merely illustrative of the invention. It will be understood that various changes in such detail are within the scope of the invention, which is to be limited only by the following claims.

What is claimed is:

1. A method comprising:

providing a semiconductor wafer; and forming a dielectric layer on the semiconductor wafer in a chemical vapor deposition process, the chemical vapor deposition process including introducing at least one reactant substance that includes hydrogen, the chemical vapor deposition process including the step of introducing, deuterium during at least a portion of the chemical vapor deposition process so that at least some deuterium enters into the dielectric layer.

2. The method of claim 1, wherein the dielectric layer forming step comprises introducing silane as the at least one reactant substance including hydrogen.

3. The method of claim 1, wherein the dielectric layer forming step comprises introducing ammonia as the at least one reactant substance including hydrogen.

4. The method of claim 1, wherein the dielectric layer forming step comprises introducing tetra-ethyl-orthosilicate (TEOS) as the at least one reactant substance including hydrogen.

5. The method of claim 1, wherein the dielectric layer forming step comprises introducing deuterium as a gas.

6. The method of claim 1, wherein the dielectric layer forming step is done in a plasma enhanced chemical vapor deposition process.

7. The method of claim 1, wherein the dielectric layer forming step is done after forming a metal layer on the semiconductor substrate, the dielectric layer forming step being done at a temperature to minimize the melting of the metal layer.

8. The method of claim 1, wherein the dielectric layer forming step is such that hydrogen is formed as a by-product of the reaction of the reactant substances.

9. The method of claim 8, wherein at least some of the by-product hydrogen is in the form of a free radical of hydrogen.

10. The method of claim 1, wherein the dielectric layer forming step is such that the dielectric layer comprises an oxide.

11. The method of claim 1, wherein the dielectric layer forming step is such that the dielectric layer comprises a nitride.

12. The method of claim 1, wherein the dielectric layer forming step is such that the dielectric layer comprises an oxynitride.

13. The method of claim 1, wherein the dielectric layer forming step is such that the dielectric layer is formed on a metal layer.

14. The method of claim 1, wherein the dielectric layer forming step includes introducing deuterium at the beginning of the process.

15. The method of claim 1, wherein the dielectric layer forming step includes introducing deuterium at the end of the process.

* * * * *